Figure 1:
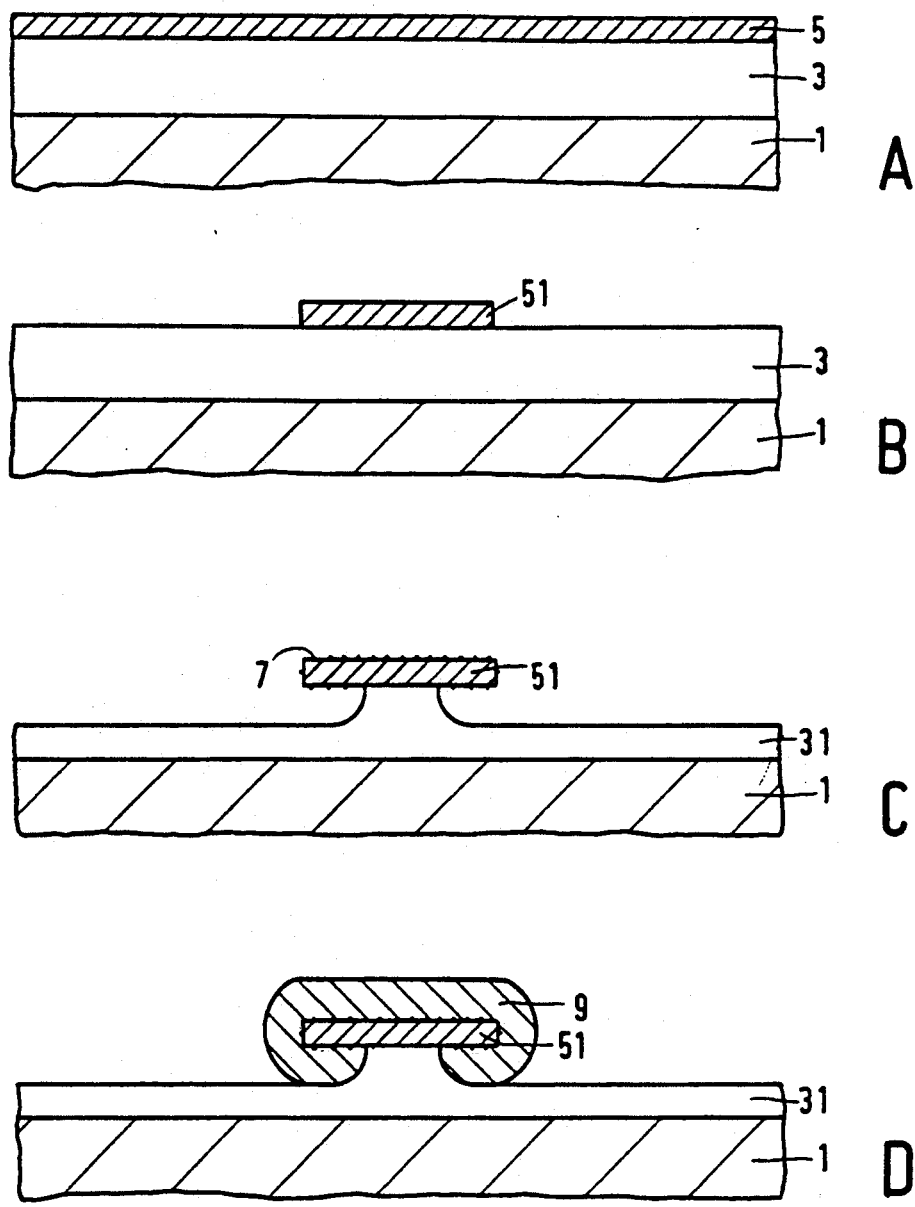

United States Patent [19]

van der Putten

[11] Patent Number: 5,246,732
[45] Date of Patent: Sep. 21, 1993

[54] METHOD OF PROVIDING A COPPER PATTERN ON A DIELECTRIC SUBSTRATE

[75] Inventor: Andreas M. T. P. van der Putten, Eindhoven, Netherlands

[73] Assignee: U.S. Philips Corporation, New York, N.Y.

[21] Appl. No.: 907,420

[22] Filed: Jul. 1, 1992

[30] Foreign Application Priority Data

Jul. 16, 1991 [EP] European Pat. Off. ........ 91201870.2

[51] Int. Cl.⁵ .............................................. C23C 26/00
[52] U.S. Cl. ........................................ 427/96; 427/98; 427/301; 427/307; 156/662
[58] Field of Search ................. 427/98, 96, 307, 301; 156/662

[56] References Cited

U.S. PATENT DOCUMENTS

| | | | |
|---|---|---|---|
| 3,485,665 | 12/1969 | De Angelo | 427/98 |
| 4,328,080 | 5/1982 | Harris | 427/307 |
| 4,946,709 | 8/1990 | Takada | 427/98 |

FOREIGN PATENT DOCUMENTS 152664 8/1984 Japan ................................. 156/662

Primary Examiner—Terry J. Owens
Assistant Examiner—Vi Dung Dang
Attorney, Agent, or Firm—Paul R. Miller

[57] ABSTRACT

The adhesion of electroless copper to a substrate (1) for a conductor pattern can be improved by applying a $SiO_2$ layer (3) on which a thin metal pattern of, for example, TiW (51) is provided. Anchors are formed on the surface by subjecting the $SiO_2$ layer to an under-etching treatment. The electroless copper (9) grows around these anchors and, hence, adheres to the substrate.

13 Claims, 1 Drawing Sheet

METHOD OF PROVIDING A COPPER PATTERN ON A DIELECTRIC SUBSTRATE

The invention relates to a method of providing a copper pattern on a dielectric substrate.

Copper is an important material for the manufacture of electrically conductive patterns on dielectric substrates such as ceramic, glass and synthetic resins. For this purpose, so-called electroless copper has been used for a long time with the copper being deposited from an aqueous solution of a copper salt and a reducing agent. Copper is deposited only at locations where the substrate surface is provided with catalytic nuclei such as metallic palladium. Due to a small affinity for oxygen, copper adheres poorly to ceramic and glass substrates. The adhesion of the copper to the substrate can be improved by surface-roughening processes such as sand blasting or selectively lixiviating particles incorporated in the substrate.

In European Patent EP-B-219122, a description is given of a method of improving the adhesion of an electrolessly deposited metal, for example copper, to a ceramic substrate of AlN. For this purpose, the AlN surface is treated with a concentrated aqueous solution of NaOH. In this process, the ceramic grains of the AlN are etched, thereby forming narrow pores. The electroless copper which is deposited on the roughened surface also fills the pores, thereby mechanically anchoring the copper layer to the AlN surface.

A disadvantage of the known method is that this mechanical adhesion operation is difficult to control and is unsuitable for the manufacture of very fine copper patterns on flat substrates. The surface roughness provided, which is of the order of a few $\mu$m, is too large for copper patterns which also have a line width of a few $\mu$m. Such small line widths are used, inter alia, in circuits on which semiconductor devices (ICs and LSIs) are directly provided (so-called flip chip principle).

It is an object of the invention to provide, inter alia, a method of improving the adhesion between a copper pattern and a dielectric substrate on which the copper pattern is provided, in which method the copper patterns can have a line width of a few $\mu$m (for example 3 $\mu$m) by ensuring that the bonding of the copper patterns to the substrate takes place in a controlled manner.

According to the invention, this object is achieved by a method which is characterized by the following steps:
  applying a uniform metal layer to the dielectric substrate,
  etching the metal layer according to a pattern, thereby forming a metal pattern which corresponds to the copper pattern to be formed,
  partially underetching the metal pattern formed by wet-chemical etching,
  activating the metal pattern with an aqueous Pd salt solution,
  electroless copper plating the activated metal pattern, thereby forming the copper pattern.

The uniform metal layer must adhere well to the substrate and is, for example, an Al layer, a Ti layer or a Cl layer. A metal which adheres very well to a base of silicon oxide (SiO, $SiO_2$ or $SiO_x$, where $x<2$) is TiW which can be provided by, for example, sputtering. Conventional lithography is used to provide the metal layer with the desired pattern, for example, a line pattern having a line width of 2 $\mu$m. Subsequently, the substrate is partially etched with a suitable etchant such as to underetch the metal pattern. A suitable etchant for a silicon oxide substrate is, for example, an aqueous solution of hydrogen fluoride (HF). Metals such as TiW are not or hardly attacked by this etchant so that, as it were, metal anchors are formed on the substrate. The metal anchors are subsequently activated for the electroless copper-plating process by means of an electrochemical exchange reaction in an aqueous Pd salt solution such as, for example, $PdCl_2$. In this exchange reaction, metallic Pd nuclei are formed on the metal anchors, whereas no exchange reaction with the dielectric material takes place. As a result thereof, Pd nuclei are selectively deposited on the metal anchors, both on the upper side and on the lower side. The activated metal anchors are copper plated in an electroless copper bath. Since both the upper side and the lower side of the anchors have been activated, the electroless copper grows around the metal anchors, thereby forming an excellent adhesion. The geometry of the final copper pattern depends on the metal pattern provided, which metal pattern can be obtained on a micron scale in a simple manner by using a lithographic process.

A suitable embodiment of the method according to the invention is characterized in that a dielectric intermediate layer is applied to the dielectric substrate before the metal layer is provided. Such a dielectric intermediate layer of, for example, silicon oxide can advantageously be used when the underlying substrate cannot readily be etched with the etchant in question or when the metal layer adheres insufficiently to the substrate surface. On a silicon substrate, for example, a $SiO_2$ insufficiently layer can be provided by means of known methods such as CVD, sputtering or hydrolysis and pyrolysis of TEOS (tetraethyl oorthosilicate). The use of such a $SiO_2$ intermediate layer has the additional advantage that the metal pattern is simultaneously activated and underetched by using an aqueous activating bath which does not only contain a Pd salt but also HF. As a result thereof, a separate underetching step can be dispensed with.

Besides for manufacture of micron-scale copper patterns on printed circuit boards, the method according to the invention can be used in every field where narrow copper tracks are required, for example in hybrid circuits. Various materials, including glass, ceramic, silicon and synthetic resin, can be used as the substrate. If required, the copper can be provided with a gold-exchange layer or an electroless in layer to improve the solderability.

Satisfactory adhesion properties can be imparted to relatively large copper surfaces by growing the copper on closely spaced metal lines or squares having an interspace of for example 1 $\mu$m. In this manner, the copper layer is adhered to the substrate via several anchors.

An optimum adhesion can be obtained by virtue of the fact that the metal pattern, the metal layer thickness and the degree of underetching can be selected according to the requirements.

Figure 2:
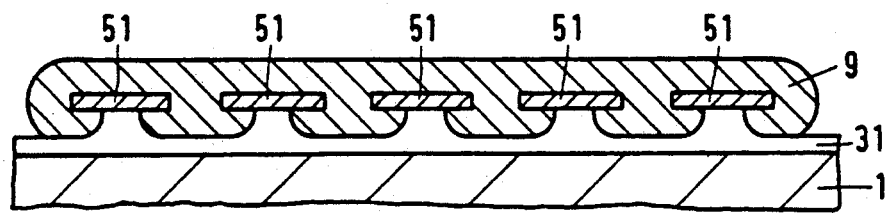

The invention will be explained in greater detail by means of exemplary embodiments and drawings, in which FIGS. 1A, 1B, 1C and 1D diagrammatically show the process steps carried out to provide a copper pattern according to the invention, and FIG. 2 diagrammatically shows a copper layer which is adhered to a substrate via several anchors.

EXEMPLARY EMBODIMENT 1

FIG. 1A diagrammatically shows a part of a cross-section of a Si substrate 1 on which a 0.7 μm thick $SiO_2$ layer 3 is provided in a manner which is known per se (for example CVD or spin-on-glass). A 0.1 μm thick TiW layer 5 is applied to the $SiO_2$ layer 3. The TiW layer is converted to the desired track pattern 51 (FIG. 1B) having a width of 2 μm. For this purpose, the TiW layer 5 is provided with a layer of a positive photoresist (for example HPR-204 from Hunt) in a customary manner and patternwise exposed to light having a wavelength of approximately 400 nm via a mask which corresponds to the desired TiW pattern. The exposed parts of the photoresist are dissolved in an alkaline developing agent after which the TiW is etched in an aqueous solution of 30 wt. % of $H_2O_2$. Subsequently, the unexposed parts of the photoresist are removed with acetone.

The TiW pattern 51 is activated for the subsequent electroless copper-plating process by immersing it in a bath containing 5 mg of $PdCl_2$, 175 μl of concentrated HCl and 1% of HF per liter of water for 1 minute. The temperature of the activating bath is 70° C. While the TiW pattern 51 is being activated, the pattern is underetched simultaneously (FIG. 1C), thereby forming TiW anchors and an etched $SiO_2$ layer 31. As a result of exchange, metallic Pd nuclei 7 are formed both on the lower side and the upper side of the TiW anchors. Under these conditions, the TiW is not attached or hardly not attacked. After rinsing with water, the TiW anchors are copper plated in an aqueous electroless copper bath having the following composition:

| | |
|---|---|
| $CuSO_4.5H_2O$ | 0.04 mol/l |
| EDTA.4Na | 0.08 mol/l |
| HCHO (formaline) | 0.05 mol/l. |

NaOH is used to adjust the pH of the bath to a value of 12.5. The temperature of the bath is 60° C. In the electroless copper bath, the TiW is copper plated for 20 minutes, thereby forming a 0.5 μm thick copper layer 9 (FIG. 1D). As the copper-growth rate is uniform in all directions, the copper grows around the TiW anchors, resulting in an excellent adhesion of the copper. The copper patterns formed have a line width of 3 μm. The conductance of electroless copper is equal to that of bulk copper: $2.0 \cdot 10^{-6}$ Ωcm, so that the narrow and thin copper lines already exhibit a satisfactory electric conduction.

EXEMPLARY EMBODIMENT

In FIG. 2, the reference numerals have the same meaning as in exemplary embodiment 1. The TiW layer is etched according to a pattern of lines or squares 51, the interspace between the lines or squares being approximately 1 μm. After the electroless copper-plating process, a continuous copper layer 9 is formed which is adhered to the substrate 1 via a number of anchors.

The method according to the invention enables narrow copper patterns having a line width of a few μm (for example 3 μm) to be adhered in a controlled manner to a dielectric substrate. In principle, relatively large copper surfaces can be provided with satisfactory adhesion properties by using a number of juxtaposed anchors.

I claim:

1. A method of providing a copper pattern on a dielectric substrate comprising the steps
   (a) applying a uniform metal layer to the dielectric substrate,
   (b) etching said metal layer to form a pattern of the metal,
   (c) partially underetching the metal pattern by a wet-chemical etching,
   (d) simultaneously activating said metal pattern with an aqueous Pd salt solution to form Pd nuclei on all sides of said metal pattern, and
   (e) thereafter electroless copper plating the activated and undercut metal pattern having Pd nuclei to form the copper pattern.

2. A method as claimed in claim 1, characterized in that TiW is used as the metal layer.

3. A method as claimed in claim 2, characterized in that a dielectric intermediate layer is applied to the dielectric substrate before the metal layer is provided.

4. A method as claimed in claim 3, characterized in that silicon oxide is used as the dielectric intermediate layer.

5. A method as claimed in claim 4, characterized in that the metal pattern is simultaneously underetched and activated by using an aqueous Pd salt solution which also comprises hydrogen fluoride.

6. A method as claimed in claim 1, characterized in that at least two juxtaposed metal patterns are copper plated, thereby forming a continuous copper pattern.

7. A method as claimed in claim 1, characterized in that a printed circuit board is used as the substrate.

8. A method as claimed in claim 1, characterized in that a dielectric intermediate layer is applied to the dielectric substrate before the metal layer is provided.

9. A method as claimed in claim 8, characterized in that silicon oxide is used as the dielectric intermediate layer.

10. A method as claimed in claim 9, characterized in that the metal pattern is simultaneously underetched and activated by using an aqueous Pd salt solution which also comprises hydrogen fluoride.

11. A method according to claim 1, wherein said metal pattern is formed with an interspacing of approximately 1 μm.

12. A method according to claim 1, wherein said copper pattern is formed with line widths of a few μm.

13. A method according to claim 1, wherein said aqueous Pd salt solution is formed of $PdCl_2$ in water and HF.

* * * * *